United States Patent
En-Ho et al.

(10) Patent No.: US 6,828,239 B2
(45) Date of Patent: Dec. 7, 2004

(54) METHOD OF FORMING A HIGH ASPECT RATIO SHALLOW TRENCH ISOLATION

(75) Inventors: Tzu En-Ho, Ilan (TW); Chang Rong Wu, Banchiau (TW); Hsin-Jung Ho, Shijr (TW)

(73) Assignee: Nanya Technology Corporation, Taoyuan (TW)

( * ) Notice: Subject to any disclaimer, the term of this patent is extended or adjusted under 35 U.S.C. 154(b) by 79 days.

(21) Appl. No.: 10/121,504

(22) Filed: Apr. 11, 2002

(65) Prior Publication Data

US 2003/0143852 A1 Jul. 31, 2003

(30) Foreign Application Priority Data

Jan. 25, 2002 (TW) ........................................ 91101215 A

(51) Int. Cl.[7] ............................................. H01L 21/301
(52) U.S. Cl. ........................ 438/700; 438/723; 438/756
(58) Field of Search ................................. 438/700, 702, 438/706, 723, 724, 756, 757

(56) References Cited

U.S. PATENT DOCUMENTS

| | | | | |
|---|---|---|---|---|
| 6,191,002 B1 * | 2/2001 | Koyanagi | ................... | 438/431 |
| 6,271,147 B1 * | 8/2001 | Tseng | ......................... | 438/725 |
| 6,337,282 B2 * | 1/2002 | Kim et al. | .................. | 438/699 |
| 6,479,405 B2 * | 11/2002 | Lee et al. | .................... | 438/782 |
| 6,501,149 B2 * | 12/2002 | Hong | ......................... | 257/510 |
| 2002/0127817 A1 * | 9/2002 | Heo et al. | ................... | 438/424 |

OTHER PUBLICATIONS

S.Wolf, Silicon Processing for the VLSI Era, vol. 4, @2000 by Lattice Press, pp. 458, 459, 473.*

* cited by examiner

Primary Examiner—Kin-Chan Chen
(74) Attorney, Agent, or Firm—Ladas & Parry

(57) ABSTRACT

A method of forming a high aspect ratio shallow trench isolation in a semiconductor substrate. The method includes the steps of forming a hard mask layer with a certain pattern on the semiconductor substrate, etching a portion of the semiconductor substrate not covered by the hard mask layer to form a high aspect ratio shallow trench in the semiconductor substrate; forming an oxide liner on the bottom and sidewall of the high aspect ratio shallow trench; performing a LPCVD to form a first oxide layer to fill the high aspect ratio shallow trench, a void being formed in the first oxide layer; etching a portion of the first oxide layer to a certain depth of the high aspect ratio shallow trench and to expose the void; and performing a HDPCVD to form a second oxide layer to fill the high aspect ratio shallow trench.

11 Claims, 5 Drawing Sheets

METHOD OF FORMING A HIGH ASPECT RATIO SHALLOW TRENCH ISOLATION

BACKGROUND OF THE INVENTION

1. Field of the Invention

The present invention relates to shallow trench isolation technology and, more particularly, to a method of forming a high aspect ratio shallow trench isolation.

2. Background

Escalating demands for high density and performance associated with ultra large scale integration require semiconductor devices with design features of 0.25 microns and under, e.g. 0.18 microns, increased transistor and circuit speeds, high reliability, and increased manufacturing throughput. The reduction of design features to 0.25 microns and under challenges the limitations of conventional semiconductor technology for isolating active regions. One type of isolation is known as local oxidation of silicon (LOCOS) that disadvantageously results in bird's beak phenomenon. The other type of isolation is shallow trench isolation (STI) that provides a very good device-to-device isolation and reduces bird's beak phenomenon.

A STI process generally includes the following steps. First, using dry or wet etching with a mask, a trench is formed in a semiconductor substrate. Next, an insulating layer is deposited on the entire surface of the semiconductor substrate to fill the trench. The insulating layer is typically formed of silicon dioxide by chemical vapor deposition (CVD), such as atmospheric pressure chemical vapor deposition (APCVD), sub-atmospheric pressure chemical vapor deposition (SACVD) or high density plasma CVD (HDPCVD). Finally, CMP is used to planarize the insulating layer, thus the insulating layer remaining in the trench serves as a STI region.

Because of the increasing complexity of electronic devices, the dimensions of semiconductor devices are shrinking, while the width of STI regions is decreasing to 0.11 $\mu$m even less, and the aspect ratio of STI regions is increasing over 3. Even if a HDPCVD with good filling capability is employed, voids or seams still exist in the STI regions. Those defects cause short circuits between devices when conductive materials are deposited in subsequent processes, and thus reduce the lifetime of the device.

SUMMARY OF THE INVENTION

The object of the present invention is to solve the above-mentioned problems and to provide a method of forming a high aspect ratio shallow trench isolation.

The present invention discloses a method of forming a high aspect ratio shallow trench isolation in a semiconductor substrate, comprising the steps of forming a hard mask layer with a certain pattern on the semiconductor substrate, etching a portion of the semiconductor substrate not covered by the hard mask layer to form a high aspect ratio shallow trench in the semiconductor substrate; forming an oxide liner on the bottom and sidewall of the high aspect ratio shallow trench; performing a LPCVD to form a first oxide layer to fill the high aspect ratio shallow trench, a void being formed in the first oxide layer; etching a portion of the first oxide layer to a certain depth of the high aspect ratio shallow trench and to expose the void; and performing a HDPCVD to form a second oxide layer to fill the high aspect ratio shallow trench.

Furthermore, the invention proposes a method of forming a high aspect ratio shallow trench isolation in a semiconductor substrate, comprising the steps of forming a hard mask layer with a certain pattern on the semiconductor substrate, etching a portion of the semiconductor substrate not covered by the hard mask layer to form a high aspect ratio shallow trench in the semiconductor substrate; forming an oxide liner on the bottom and sidewall of the high aspect ratio shallow trench; performing a spin coating to form a glass layer to fill the high aspect ratio shallow trench; etching a portion of the glass layer to a certain depth of the high aspect ratio shallow trench; and performing a HDPCVD to form a oxide layer to fill the high aspect ratio shallow trench.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Embodiment 1

Figure 1A:
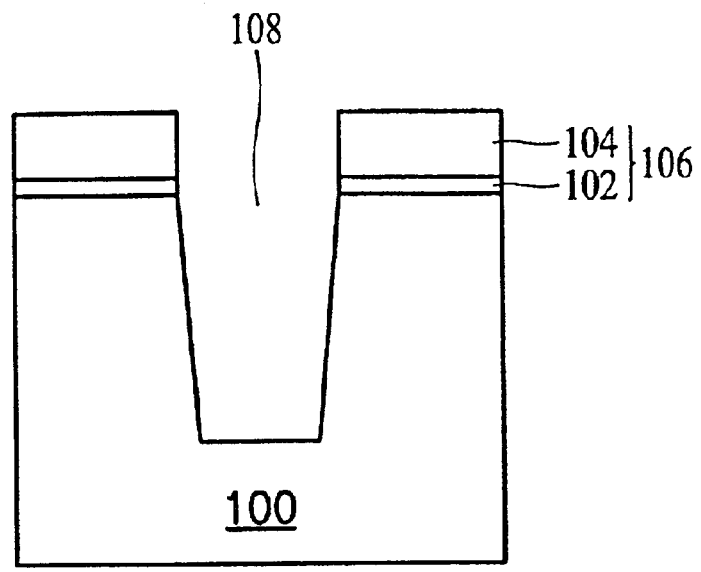
FIGS. 1A through 1F illustrate, in cross section, the process of embodiment 1 according to the present invention.

FIGS. 1A to 1F are sectional diagrams showing a novel STI process according to the Embodiment 1. As shown in FIG. 1A, a semiconductor substrate 100 is provided with a pad oxide layer 102 and a nitride layer 104. The pad oxide layer 102 is preferably formed by thermal oxidation. The nitride layer 104 is preferably formed by chemical vapor deposition (CVD) process and has a thickness of 100 angstroms. Then, using photolithography, a photo-resist layer (not shown) is patterned to form a certain pattern corresponding to the subsequently formed trench. Next, using dry or wet etching with the patterned photo-resist layer as a mask, a hard mask layer 106 with the certain pattern is formed on the semiconductor substrate 100. The hard mask layer 106 consists of the pad oxide layer 102 and the nitride layer 104. Next, using reactive ion etching (RIE) with the hard mask layer 106 as a mask, a high aspect ratio shallow trench 108 of 3000 angstroms depth and less than 1100 angstroms width is formed in the silicon substrate 100. Thus, the high aspect ratio shallow trench has an aspect ratio greater than 3. Thereafter, as shown in FIG. 1A, the patterned photo-resist layer is removed.

Figure 1B:
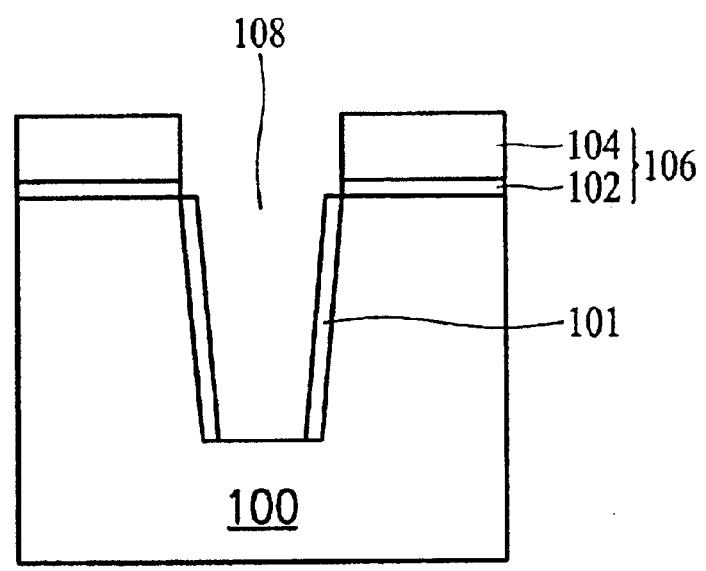

As shown in FIG. 1B, using wet or dry thermal oxidation, an oxide liner 110 is grown on the bottom and sidewall of the high aspect ratio shallow trench 108 to control the silicon—silicon dioxide interface quality. Preferably, the wet thermal oxidation is performed in a oxygen-hydrogen-containing atmosphere at 800 to 850° C., while the dry thermal oxidation is performed in a oxygen-containing atmosphere at 900 to 950° C. The oxide liner 110 has a thickness of 200 to 400 angstroms.

Figure 1C:
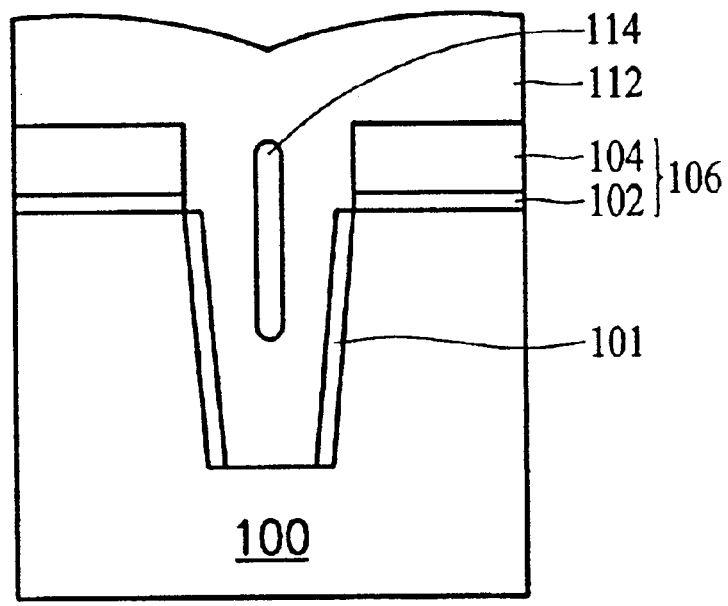

Next, as shown in FIG. 1C, using low pressure chemical vapor deposition (LPCVD) in a tetra-ethyl-ortho-silicate (TEOS) and ozone-containing atmosphere, a first oxide layer 112 is formed to fill the high aspect ratio shallow trench 108. At the same time, a void 114 is formed in the first oxide layer 112. The first oxide layer 112 has a thickness of 2000 to 5000 angstroms.

Figure 1D:
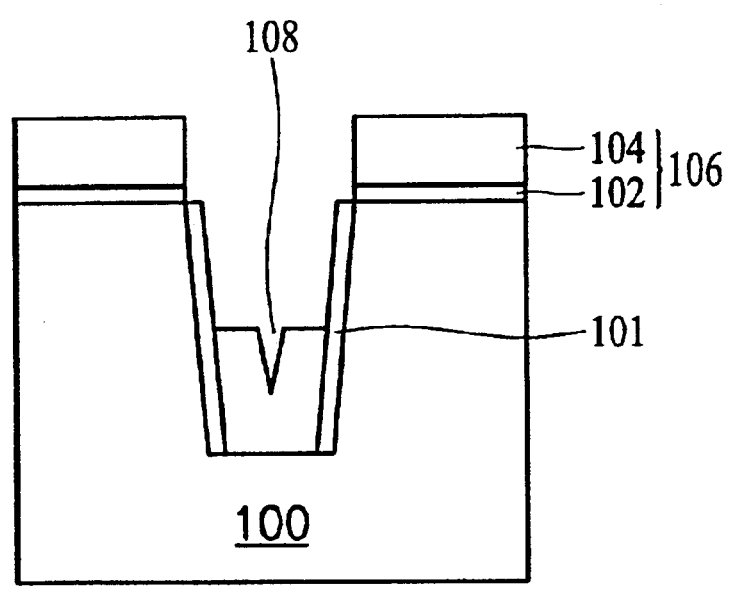

As shown in FIG. 1D, using dry or wet etching, a portion of the first oxide layer 112 is etched to a certain depth of the high aspect ratio shallow trench 108 and to expose the void 114. A dilute HF solution is used as the etchant to selectively wet etch the first oxide layer 112.

Figure 1E:
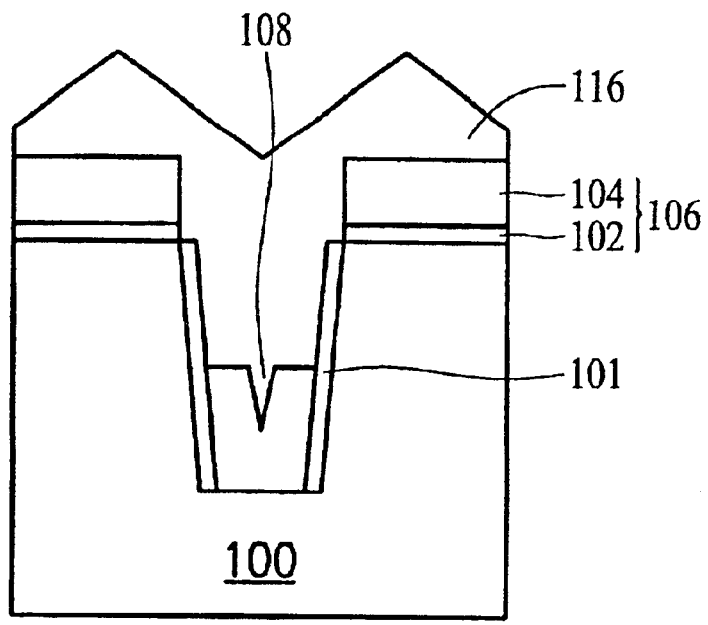

Next, as shown in FIG. 1E, using high density plasma chemical vapor deposition (HDPCVD) in a tetra-ethylortho-silicate (TEOS) and ozone-containing atmosphere, a second oxide layer 116 is formed to fill the high aspect ratio shallow trench 108. The second oxide layer 116 has a thickness of 3000 to 6000 angstroms. Then, a thermal annealing is performed to densify the second oxide layer 116.

Figure 1F:
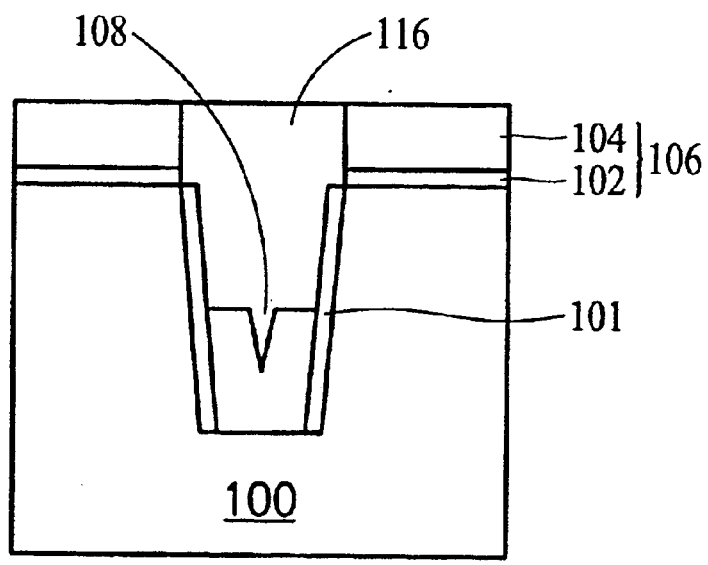

Finally, as shown in FIG. 1F, CMP is used to planarize the second oxide layer 116 until reaching the top of the hard mask layer 106. The hard mask layer 106 is used as a polishing stop layer.

Embodiment 2

Referring to FIGS. 1A to 1B and 2A to 2D, the second embodiment of the invention is illustrated. First, referring to FIGS. 1A to 1B, the same processes and steps as those in the first embodiment, wherein each part with the same denotation possesses the same function.

Figure 2A:
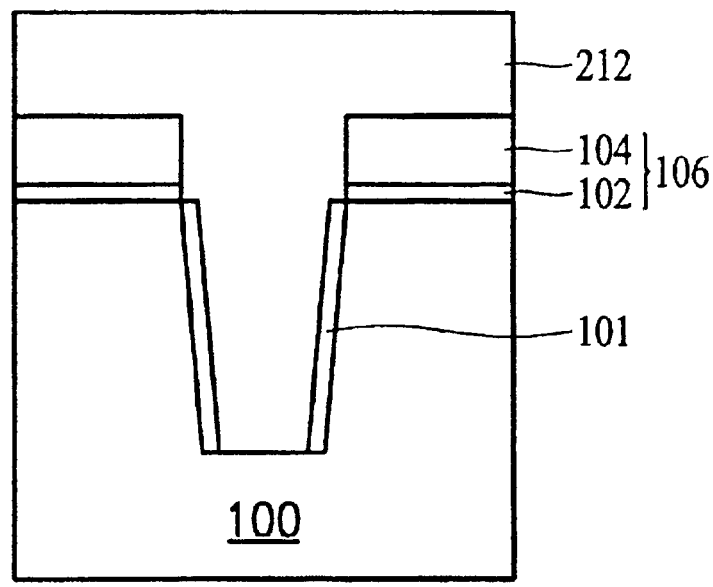
FIGS. 2A through 2D illustrate, in cross section, the process of embodiment 2 according to the present invention.

As shown in FIG. 2A, using spin coating, a glass layer 212 is formed to fill the high aspect ratio shallow trench 108. The glass layer 212 has a thickness of 2000 to 7000 angstroms. The glass layer 212 has good filling capability so the high aspect ratio shallow trench 108 can be filled up. Then, a thermal annealing is performed to densify the glass layer 212.

Figure 2B:
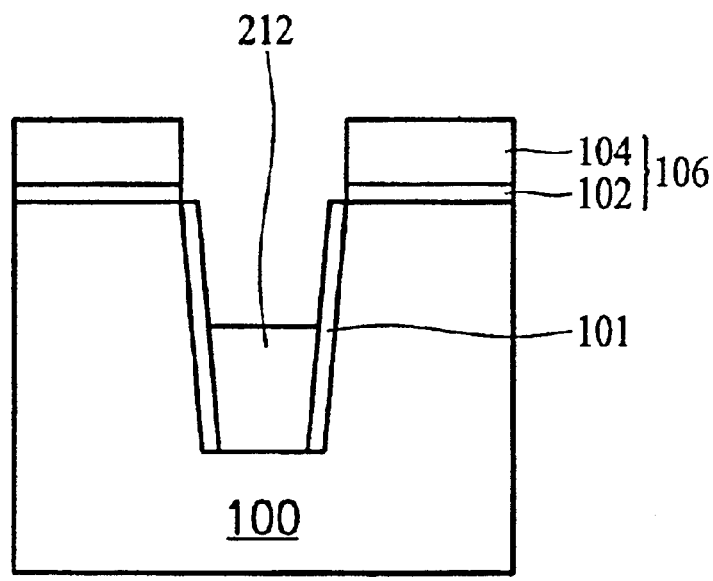

Next, as shown in FIG. 2B, using dry or wet etching, a portion of the glass layer 212 is etched to a certain depth of the high aspect ratio shallow trench 108. A dilute HF solution is used as the etchant to selectively wet etch the glass layer 212.

Figure 2C:
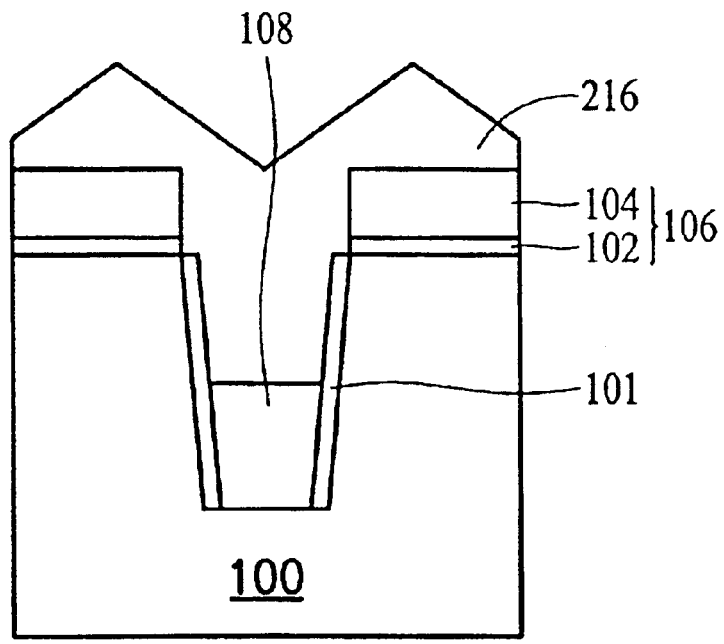

As shown in FIG. 2C, using high density plasma chemical vapor deposition (HDPCVD) in a tetra-ethyl-ortho-silicate (TEOS) and ozone-containing atmosphere, a second oxide layer 216 is formed to fill the high aspect ratio shallow trench 108. The second oxide layer 216 has a thickness of 3000 to 6000 angstroms. Then, a thermal annealing is performed to densify the second oxide layer 216.

Figure 2D:
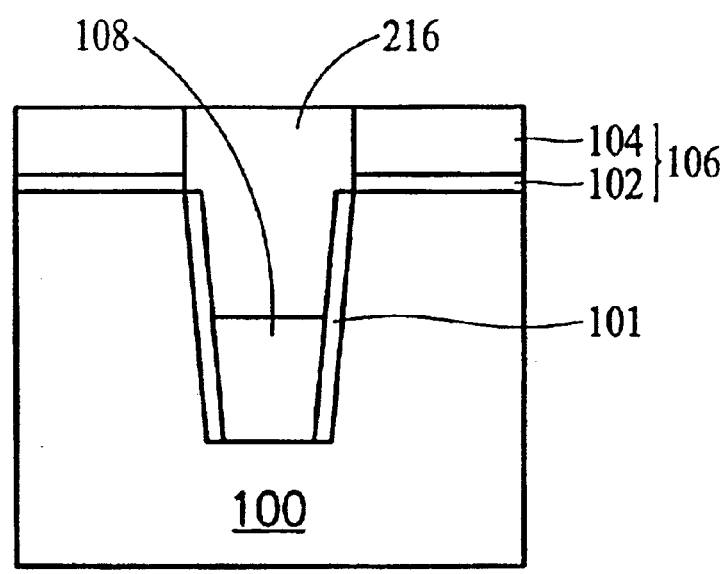

Finally, as shown in FIG. 2D, CMP is used to planarize the second oxide layer 216 until reaching the top of the hard mask layer 106. The hard mask layer 106 is used as a polishing stop layer.

The present invention provides the two different processes to form a high aspect ratio shallow trench isolation in which voids or seams are eliminated, thereby increasing the lifetime of the device.

It is to be understood that the present invention is not limited to the embodiments described above, but encompasses any and all embodiments within the scope of the following claims.

What is claimed is:

1. A method of forming a high aspect ratio shallow trench isolation in a semiconductor substrate, comprising the steps of:

forming a hard mask layer with a certain pattern on the semiconductor substrate;

etching a portion of the semiconductor substrate not covered by the hard mask layer to form a high aspect ratio shallow trench in the semiconductor substrate;

forming an oxide liner on the bottom and sidewall of the high aspect ratio shallow trench;

performing a LPCVD to form a first oxide layer overlaying the semiconductor substrate and the hard mask layer to fill the high aspect ratio shallow trench, wherein a void is formed in the first oxide layer and situated above the semiconductor substrate level, etching a portion of the first oxide layer to a certain depth of the high aspect ratio shallow trench and to expose the void, and to remove the first oxide layer overlying the hard mask layer; and performing a HDPCVD to form a second oxide layer on the first oxide layer to fill the high aspect ratio shallow trench, wherein the second oxide layer above the semiconductor substrate level is void-free.

2. The method as recited in claim 1, further comprising a step of annealing the second oxide layer to densify the second oxide layer.

3. The method as recited in claim 1, wherein the hard mask layer comprises a nitride layer.

4. The method as recited in claim 1, wherein the high aspect ratio shallow trench is formed by a reactive ion etching.

5. The method as recited in claim 1, wherein the high aspect ratio shallow trench has an aspect ratio greater than 3.

6. The method as recited in claim 1, wherein the first oxide layer and second oxide layer comprises tetra-ethyl-orthosilicate.

7. The method as recited in claim 1, wherein the first oxide layer has a thickness of 2000 to 5000 angstroms.

8. The method as recited in claim 1, wherein etching a portion of the first oxide layer is performed by dry or wet etching.

9. The method as recited in claim 1, wherein the second oxide layer has a thickness of 3000 to 6000 angstroms.

10. The method as recited in claim 1, further comprising a step of using chemical mechanical polishing to planarize the second oxide layer.

11. The method as recited in claim 1, wherein the second oxide layer is formed on the first oxide layer to fill the high aspect ratio shallow trench.

* * * * *